(12) United States Patent
Sayuk

(10) Patent No.: US 8,493,139 B2
(45) Date of Patent: Jul. 23, 2013

(54) LOW NOISE AUTO-ZERO CIRCUITS FOR AMPLIFIERS

(75) Inventor: Mark Sayuk, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 12 days.

(21) Appl. No.: 13/299,349

(22) Filed: Nov. 17, 2011

(65) Prior Publication Data

US 2013/0127526 A1    May 23, 2013

(51) Int. Cl.
    H03F 1/02    (2006.01)
(52) U.S. Cl.
    USPC ............................................. 330/9
(58) Field of Classification Search
    USPC ........................................ 330/9, 69; 327/307
    See application file for complete search history.

(56) References Cited

U.S. PATENT DOCUMENTS

| | | | |
|---|---|---|---|
| 5,363,055 A | 11/1994 | Ribner | |
| 6,169,427 B1 | 1/2001 | Brandt | |
| 6,252,454 B1 | 6/2001 | Thompson et al. | |
| 6,498,530 B1 | 12/2002 | Tang | |
| 7,642,846 B2 | 1/2010 | Yan | |
| 7,719,351 B2 | 5/2010 | Pertijs et al. | |
| 8,319,550 B2 * | 11/2012 | Prasad et al. | 330/9 |
| 2005/0017889 A1 | 1/2005 | Stockstad | |
| 2006/0197574 A1 | 9/2006 | Naviasky et al. | |
| 2007/0103203 A1 | 5/2007 | Makihara | |
| 2009/0304092 A1 | 12/2009 | Takemoto et al. | |

OTHER PUBLICATIONS

Kruger, Switched-Capacitor Filters, "55:041 Electronic Circuits," University of Iowa, Fall 2006. retrieved from http://old.iihr.uiowa.edu/~hml/people/kruger/Teaching/ece_55041_2007/SwitchedCapacitorFilters.pdf.
Razavi, Design of Analog CMOS Integrated Circuits, "13.2.1 Offset Cancellation Techniques," pp. 471-476, McGraw-Hill, 2001.
PCT International Search Report and Written Opinion from PCT/US12/63640 mailed on Feb. 1, 2013.

* cited by examiner

*Primary Examiner* — Steven J Mottola
(74) *Attorney, Agent, or Firm* — Kenyon & Kenyon LLP (57) ABSTRACT

An amplifier may include a low noise auto-zero circuit with auto-zero capacitors and switch-controlled auxiliary capacitors that function as switched-capacitor low-pass filters. In an acquisition phase of the auto-zero operation, the inputs of an amplifier may be shorted to a common voltage, and a representation of the offset voltage may be acquired by the auto-zero capacitors. In a hold phase of the auto-zero operation, the auto-zero capacitors may be connected to the auxiliary capacitors, and the resulting voltages may be applied to the circuit such that the original offset voltage is cancelled. Moreover, the switched-capacitor filters may reduce the effective sampling noise while maintaining high acquisition bandwidth.

25 Claims, 9 Drawing Sheets

LOW NOISE AUTO-ZERO CIRCUITS FOR AMPLIFIERS

BACKGROUND OF THE INVENTION

The present invention relates to amplifiers for use in integrated circuits and, particularly, to techniques for canceling offset voltages in such amplifiers.

For an ideal amplifier, when the differential input voltage is zero, the output voltage is also zero. In reality, however, the output voltage may not be zero because of device mismatches among circuit components. This offset can be expressed by an input offset voltage, which typically refers to the required input voltage to an amplifier such that the amplifier's output voltage is zero.

An offset can be caused by mismatches due to uncertainties in the device manufacturing process, such as transistor dimensions and doping levels. The presence of an offset limits the performance of an amplifier because the amplifier's output contains not only the amplified input signal, but also the amplified input offset voltage. This can be problematic in precision circuits that demand high accuracy, or when multiple amplifier channels must match one another, since mismatches are generally random and uncorrelated.

A technique, called "ping-ponging," is sometimes used to increase throughput in an amplifier signal chain. If an amplifier requires two separate phases (e.g. reset and amplify), this technique allows two amplifiers to operate out of phase with one another on the same signal path. In other words, while one amplifier is resetting, the other is amplifying, and vice versa. In this way, one of the amplifiers is always amplifying and there is no time wasted on the reset operation.

Unfortunately, differences in amplifier offsets can produce a major challenge to the use of ping-ponging in many applications. For example, if ping-ponging is used in an image sensor readout circuit and the two amplifiers have different offset voltages, the technique can generate fixed patterns in the image, where even and odd columns have different offsets with respect to one another. The human eye is sensitive to image artifacts such as these, making them undesirable. Robust auto-zero techniques can be used to remove these offsets and eliminate such effects.

Known auto-zero circuits often apply a two-phase operation to cancel the amplifier offset. In the "acquisition" phase, the amplifier's inputs may be shorted together and a representation of the offset acquired by auto-zero capacitors. In the "hold" phase, the capacitors hold the acquired voltages, which may be applied to the circuit such that the represented offset voltage is subtracted from the inherent amplifier offset. One common issue for the known auto-zero circuits is the introduction of additional sampling noise on the auto-zero capacitors. Although the sampling noise can generally be reduced by increasing the capacitance of the capacitors, this approach can be impractical in high-speed systems because it negatively affects the acquisition bandwidth during the acquisition phase.

Figure 1:
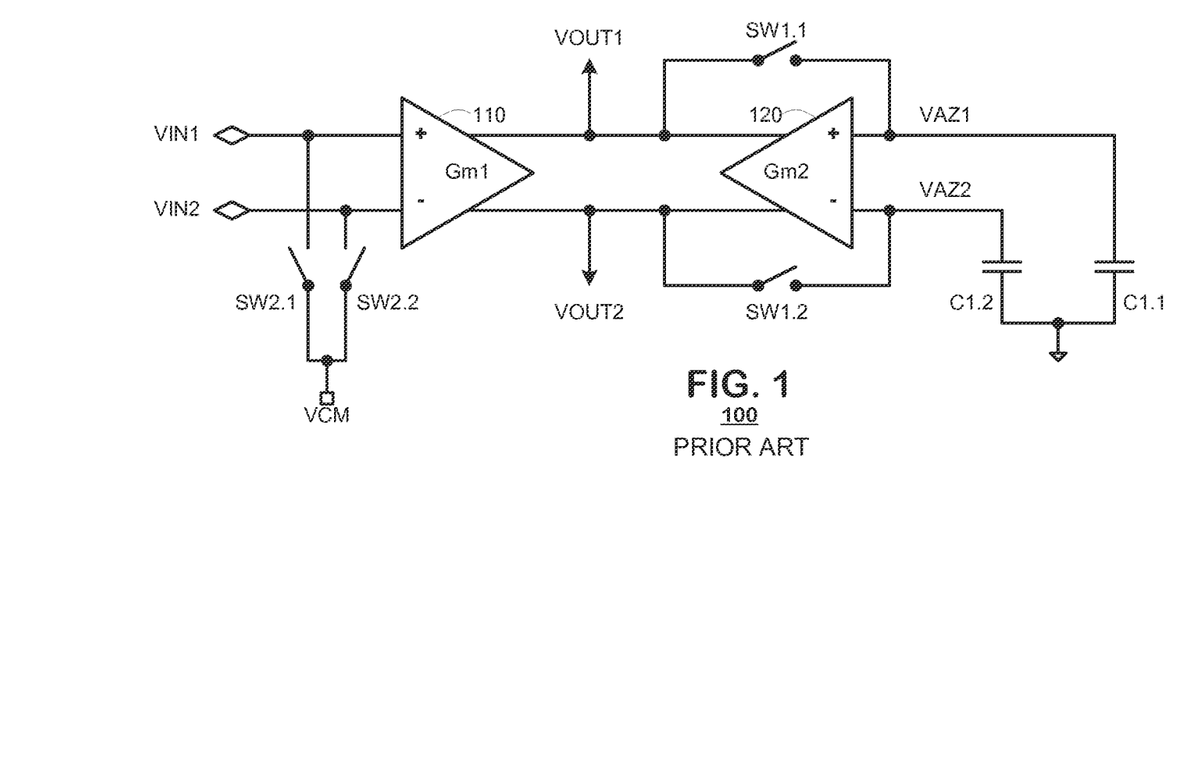
FIG. 1 is a circuit diagram of a known amplifier with auto-zero offset capacitors.

FIG. 1 illustrates an auto-zero circuit for an amplifier 100 according to the prior art. The amplifier 100 includes a pair transconductance amplifiers 110, 120 with respective transconductances Gm1 and Gm2, auto-zero capacitors C1.1, C1.2, and control switches SW1.1, SW1.2, SW2.1 and SW2.2. For purposes of this discussion it is assumed that Gm1 and Gm2 are derived from metal-oxide-semiconductor field-effect transistors (MOSFETs) with transconductances of $g_{m1}$ and $g_{m2}$, respectively.

The auto-zero circuit operates in two phases—an acquisition phase and a hold phase. In the acquisition phase, switches SW1.1, SW1.2, SW2.1 and SW2.2 are closed, which connects a common-mode voltage VCM to the inputs of the first amplifier 110. Any input offset voltage may produce a differential current at the output of the first transconductance amplifier 110, which is applied to the output of the second transconductance amplifier 120 in feedback and produces a differential voltage $\Delta V$ equal to $V_{OS}(g_{m1}/g_{m2})$ where $V_{OS}$ is the input-referred offset. The voltages at internal nodes VAZ1 and VAZ2 and, therefore, this differential voltage $\Delta V$ are acquired by auto-zero capacitors C1.1 and C2.1, respectively.

Because the inputs and the outputs of the transconductance amplifier 120 are shorted by the switches SW1.1 and SW1.2, the bandwidth in the acquisition phase, called the "acquisition bandwidth," is given by:

$$BW = \frac{g_{m2}}{2\pi C_1} \quad \text{Eq. (1)}$$

where $C_1$ represents the capacitance of each of the auto-zero capacitors C1.1 and C1.2.

Acquisition bandwidth and settling time of the auto-zero capacitors are inversely proportional to one another. More specifically, eq. (1) can be expressed as $BW=1/2\pi\tau$ where the time constant $\tau=C_1/g_{m2}$. Furthermore, settling time can be expressed as the number of time constants required to achieve a required settling accuracy, which can be derived from a required auto-zeroing accuracy. For example, in order for the capacitors to settle to 99.3% of their final value requires an acquisition time of approximately 5 time constants or $5\tau$. If the bandwidth is less than $1/2\pi\tau$, the capacitors may not fully settle, resulting in incomplete offset cancellation.

In the hold phase, switches SW1.1, SW1.2, SW2.1 and SW2.2 may be opened. The auto-zero capacitors C1.1 and C1.2 hold the voltages across them at the end of the acquisition phase and, therefore, transconductance amplifier 120 may produce an amount of current to cancel the offset produced during the acquisition phase. In this way, the output-referred offset voltage between the output nodes Vout1 and Vout2 should be cancelled and the amplifier 100 should amplify only the differential input voltage presented to it at inputs VIN1 and VIN2.

Use of the auto-zero circuit depicted in FIG. 1 may introduce additional noise components because the auto-zero capacitors C1.1 and C2.1 sample noise of the circuit in addition to the offset. However, since noise is a random signal, its instantaneous value is non-deterministic and likely will not be cancelled during the hold phase as the offset is. Nevertheless, the circuit 100 may find application in scenarios where the increase of random noise is acceptable relative to the cancellation of correlated noise.

Moreover, it can be shown that the input-referred auto-zero noise introduced by the sampling operation may be given by:

$$N_i = \sqrt{\frac{S(f) \cdot \Delta f}{g_{m1}^2}} \quad \text{Eq. (2)}$$

$$= \sqrt{\frac{\left[2\left(\frac{8kT}{3}(g_{m1} + g_{m2})\right)\right]\left[\frac{g_{m2}}{4C_1}\right]}{g_{m1}^2}}$$

$$= \frac{1}{g_{m1}}\sqrt{\frac{4kT}{3C_1}(g_{m1} + g_{m2})g_{m2}}$$

where $N_i$ is the input-referred auto-zero noise, S(f) is the noise spectral density, and Δf is the noise bandwidth.

As previously discussed, the acquisition bandwidth is $g_{m2}/(2\pi C_1)$, and determines the settling time of the auto-zero capacitors. Therefore, it may be difficult to simultaneously achieve acceptable input-referred auto-zero noise and fast enough settling for a given application. For example, in order to lower input-referred auto-zero noise, it is desirable to reduce $g_{m2}$. However, reducing $g_{m2}$ may lower the acquisition bandwidth and increase settling time. Similarly, increasing $C_1$ lowers the input-referred auto-zero noise, but may lower the acquisition bandwidth, also leading to increased settling time.

As noted, these designs can suffer from a tradeoff between cycle-to-cycle sampling noise and acquisition bandwidth. Accordingly, there is a need in the art for an auto-zero amplifier circuit that can maintain a high acquisition bandwidth with reduced sampling noise.

DETAILED DESCRIPTION

Embodiments of the present invention reduce offset voltages of amplifiers by employing a low noise auto-zero circuit having a pair of switch-controlled auxiliary capacitors in parallel with auto-zero capacitors that function as switched-capacitor low-pass filters. In an acquisition phase, the inputs of an amplifier may be shorted to a common voltage, and a representation of the offset voltage may be acquired by the auto-zero capacitors. In a hold phase of the auto-zero operation, the auto-zero capacitors may be connected to the auxiliary capacitors, and the resulting voltages may be applied to the circuit such that the represented offset voltage is subtracted from the inherent amplifier offset. Moreover, the switched-capacitor filters may reduce the effective sampling noise while maintaining high acquisition bandwidth.

Figure 2A:
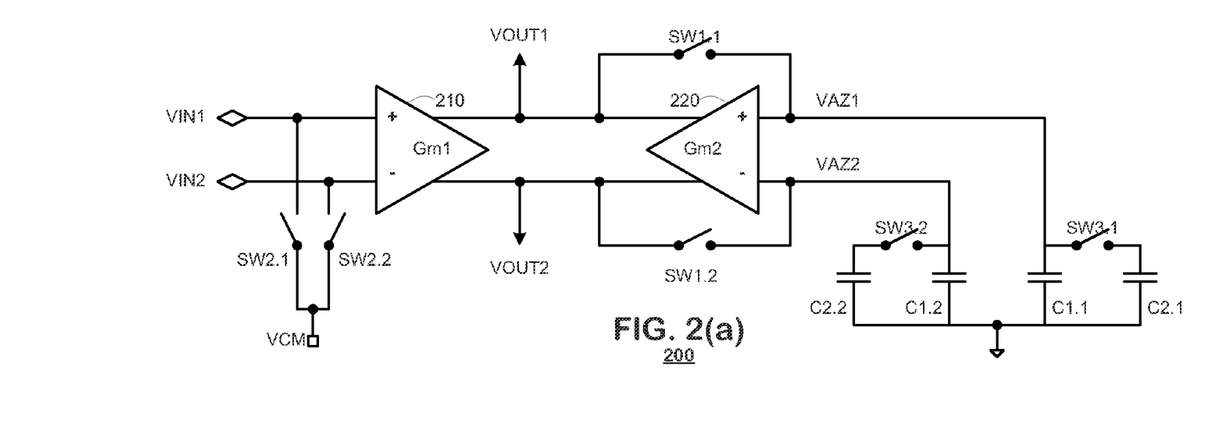
FIGS. 2(a) and (b) respectively illustrate an amplifier system according to an embodiment of the present invention and a timing diagram.

FIG. 2(a) illustrates an auto-zero circuit for an amplifier system 200 according to an embodiment of the present invention. The amplifier system 200 may include a pair of transconductance amplifiers 210, 220 with respective transconductances Gm1 and Gm2, auto-zero capacitors C1.1, C1.2, and a pair of auxiliary capacitors C2.1, C.2.2. For purposes of this discussion it is assumed that Gm1 and Gm2 are derived from MOSFETs with transconductances of $g_{m1}$ and $g_{m2}$, respectively. Inputs of a first transconductance amplifier 210 may be connected to input terminals VIN1, VIN2 of the amplifier system 200, which receive differential input signals. Inputs of the first transconductance amplifier 210 also may be connected to a common mode voltage source VCM via respective switches SW2.1, SW2.2. Inputs of the second transconductance amplifier 220 may be coupled to outputs of the first transconductance amplifier via switches SW1.1 and SW1.2.

The auto-zero capacitors C1.1, C1.2 may be coupled to respective inputs of the second transconductance amplifier 220 and ground. The auxiliary capacitors C2.1, C2.2 may be provided in parallel with the auto-zero capacitors C1.1, C1.2 and switched in and out of the system 200 via respective switches SW3.1 and SW3.2. The first auto-zero capacitor C1.1, auxiliary capacitor C2.1 and switch SW3.1 may form a switched-capacitor low-pass filter, as does C1.2, C2.2, and SW3.2. For the purposes of the present discussion, the capacitance of capacitors C1.1, C1.2, C2.1 and C2.2 is immaterial to the operation of the present invention unless explained hereinbelow.

The system 200 may have two phases of operation—an acquisition phase and a hold phase. In the acquisition phase, switches SW1.1, SW1.2, SW2.1 and SW2.2 may close, and switches SW3.1 and SW3.2 may open. Because the switches SW3.1 and SW3.2 are open, the auxiliary capacitors C1.2 and C2.2 do not affect the auto-zero operation in the acquisition phase. Thus, the auto-zero capacitors C1.1 and C2.1 may acquire voltages generated at nodes VAZ1 and VAZ2 by the two transconductance amplifiers 210, 220. The acquisition bandwidth of the FIG. 2 embodiment is given by:

$$BW = \frac{g_{m2}}{2\pi C_1} \qquad \text{Eq. (3)}$$

which matches the acquisition bandwidth of a FIG. 1 circuit having similar $g_{m2}$ and $C_1$ values.

In the hold phase, switches SW3.1, SW3.2 may close, and switches SW1.1, SW1.2, SW2.1 and SW2.2 may open. As a result, the charges stored across the auto-zero capacitors C1.1 and C1.2 may be shared respectively with the auxiliary capacitors C2.1 and C2.2. Over multiple cycles of the acquisition-hold operation, charge redistribution between the auto-zero capacitors C1.1, C1.2 and the auxiliary capacitors C2.1, C2.2 may reach equilibrium, and the voltages across the auxiliary capacitors C2.1, C2.2 may converge, respectively, to the voltages stored across the auto-zero capacitors C1.1, C1.2 during the hold phase. Effectively, the auxiliary capacitors C2.1, C2.2 are pre-charged to offset canceling voltages before the hold phase is engaged. Accordingly, after multiple cycles, the output nodes VOUT1 and VOUT2 may exhibit a substantially zero offset voltage.

Noise performance of the FIG. 2 embodiment is improved over the FIG. 1 circuit structure. Over multiple clock cycles, the input-referred auto-zero noise of the FIG. 2 embodiment may converge to:

$$N_i = \frac{1}{g_{m1}} \sqrt{\frac{4kT}{3C_1}(g_{m1} + g_{m2})g_{m2}} \sqrt{\frac{C_1}{C_1 + 2C_2}} \qquad \text{Eq. (4)}$$

where $C_1$ represents the capacitance of the auto-zero capacitors C1.1, C1.2 and $C_2$ represents the capacitance of the auxiliary capacitors C2.1, C2.2. Although the capacitance of capacitors C1.1, C1.2, C2.1 and C2.2 may differ slightly due to manufacturing variations, etc., Eq. 3 illustrates them as having common capacitances $C_1$ and $C_2$. The above analysis also assumes that the thermal noise due to the resistance of the switches SW3.1 and SW3.2 is negligible.

Compared to the input-referred noise in the auto-zero circuit depicted in FIG. 1, the added auxiliary capacitors C2.1, C2.2 may attenuate the noise by a factor $\sqrt{C_1/(C_1+2C_2)}$. Effectively, cycle-to-cycle noise effects that would have created errors in the voltages captured by auto-zero capacitors of the FIG. 1 circuit are averaged out by auxiliary capacitors in the FIG. 2 embodiment. The attenuation can be made greater by making $C_2$ large with respect to $C_1$. For example, if $C_2 = 7C_1$, the input-referred noise is reduced to approximately 25.8% of its original value. Moreover, since the acquisition bandwidth, $BW = g_{m2}/(2\pi C_1)$, does not depend on $C_2$, a small $C_1$, a large $g_{m2}$, or both may be used to achieve a high acquisition bandwidth while a large $C_2$ may be used to keep input-referred noise low. In this way, the acquisition bandwidth and auto-zero noise may be decoupled from one another.

As noted before, the first auto-zero capacitor C1.1, auxiliary capacitor C2.1, and switch SW3.1 may form a first switched-capacitor low-pass filter. Similarly, a second low-pass filter is formed by the second auto-zero capacitor C1.2, auxiliary capacitor C2.2 and switch SW3.2. It can be shown that the 3 dB frequency for the low-pass filter is given by:

$$f_{3db} = \frac{f_{CLK} C_1}{2\pi C_2} \qquad \text{Eq. (5)}$$

where $f_{CLK}$ is the clock frequency for the switches SW3.1 and SW3.2. In addition to removing fixed offsets, the auto-zero circuit may also attenuate low frequency noise generated within the amplifier. Due to the low-pass filter, the embodiment of FIG. 2 tends to attenuate amplifier frequency components less than $f_{3dB}$ and pass frequency components higher than $f_{3dB}$.

Figure 2B:
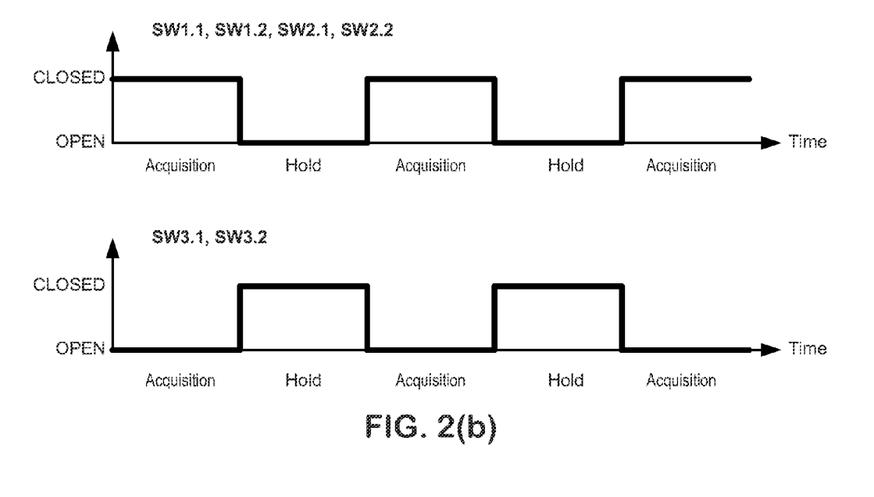

FIG. 2(b) illustrates driving signals that may be applied to the amplifier system 200 of FIG. 2(a) according to an embodiment of the present invention. During the acquisition phase, the switches SW1.1, SW1.2, SW2.1 and SW2.2 may close and the switches SW3.1 and SW3.2 may open. During the hold phase, the switches SW1.1, SW1.2, SW2.1 and SW2.2 may open and the switches SW3.1 and SW3.2 may close. Although the acquisition and hold phases are illustrated as having common durations, this is not required; the acquisition phase may have a different period than the hold phase.

The principles of the present invention may be extended to other configurations of amplifiers, auto-zero, and auxiliary capacitors. The invention may also utilize various amplifier topologies, such as telescopic, mirrored, folded-cascode, gain-boosted, single-stage, two-stage, or multi-stage and can be fabricated in CMOS, MOS, bipolar, BiCMOS, SiGe, or any other type of process technology. For the purpose of the present discussion, the configuration, amplifier topology, and process technology are immaterial to the operation of the present invention unless explained hereinbelow.

Figure 3A:
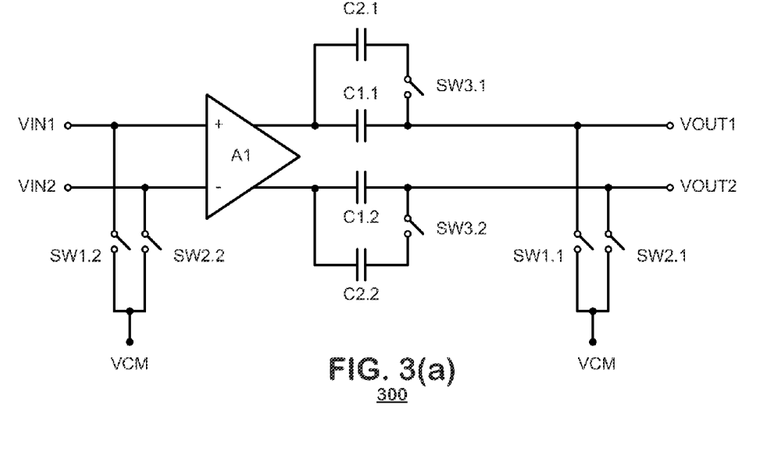
FIGS. 3(a) and (b) illustrate amplifier systems according to other embodiments of the present invention.

For example, FIG. 3(a) illustrates an auto-zero circuit for an amplifier system 300 according to another embodiment of the present invention. The amplifier system 300 may include a differential amplifier A1 with input nodes VIN1 and VIN2, and output nodes VOUT1 and VOUT2. The auto-zero circuit may include auto-zero capacitors C1.1, C1.2, auxiliary capacitors C2.2, C2.2, and switches SW1.1, SW1.2, SW2.1 SW2.2, SW3.1 and SW3.2. The auto-zero capacitors C1.1 and C1.2 may be couple to outputs of the differential amplifier A1 and to output terminals VOUT1, VOUT2 of the system 300. The auxiliary capacitors C2.1, C2.2 may be connected in parallel with the auto-zero capacitors C1.1, C1.2 and switched in and out of the circuit by respective switches SW3.1, SW3.2.

As in the prior embodiment, over several cycles of operation, the auxiliary capacitors C2.1, C2.2 should charge to voltages developed by the auto-zero capacitors C1.1, C1.2 during acquisition phases. Cycle-to-cycle noise effects should be mitigated during hold phases by contributions of the auxiliary capacitors C2.1, C2.2.

Figure 3B:
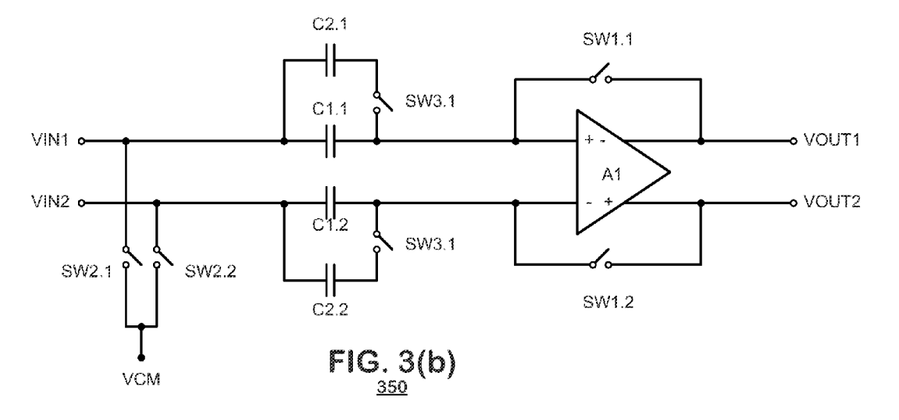

FIG. 3(b) illustrates an amplifier system 350 according to a further embodiment of the present invention. The amplifier system 350 may include a differential amplifier A1 with input nodes VIN1 and VIN2 and output nodes VOUT1 and VOUT2. The auto-zero circuit may include auto-zero capacitors C1.1 and C1.2, auxiliary capacitors C2.1 and C2.2, and switches SW1.1, SW1.2, SW2.1, SW2.2, SW3.1 and SW3.2.

In the embodiment of FIG. 3(b), the auto-zero capacitors C1.1, C1.2 may be placed in an electrical path between the input terminals VIN1, VIN2 of the system 350 and inputs of the amplifier A1. The auxiliary capacitors C2.1, C2.2 may be provided in parallel with the auto-zero capacitors C1.1, C1.2 and switched in and out of the circuit by respective switches SW3.1 and SW3.2. Switches SW2.1, SW2.2 may connect input terminals of the auto-zero capacitors C1.1, C1.2 to the common mode voltage VCM. Switches SW1.1, SW1.2 may connect inputs of the amplifier A1 to respective outputs of the amplifier A1. Output terminals VOUT1, VOUT2 of the system 350 may be taken from outputs of the amplifier A1.

Again, over several cycles of operation, the auxiliary capacitors C2.1, C2.2 should charge to voltages developed by the auto-zero capacitors C1.1, C1.2 during acquisition phases. Cycle-to-cycle noise effects should be mitigated during hold phases by contributions of the auxiliary capacitors C2.1, C2.2.

Figure 4:
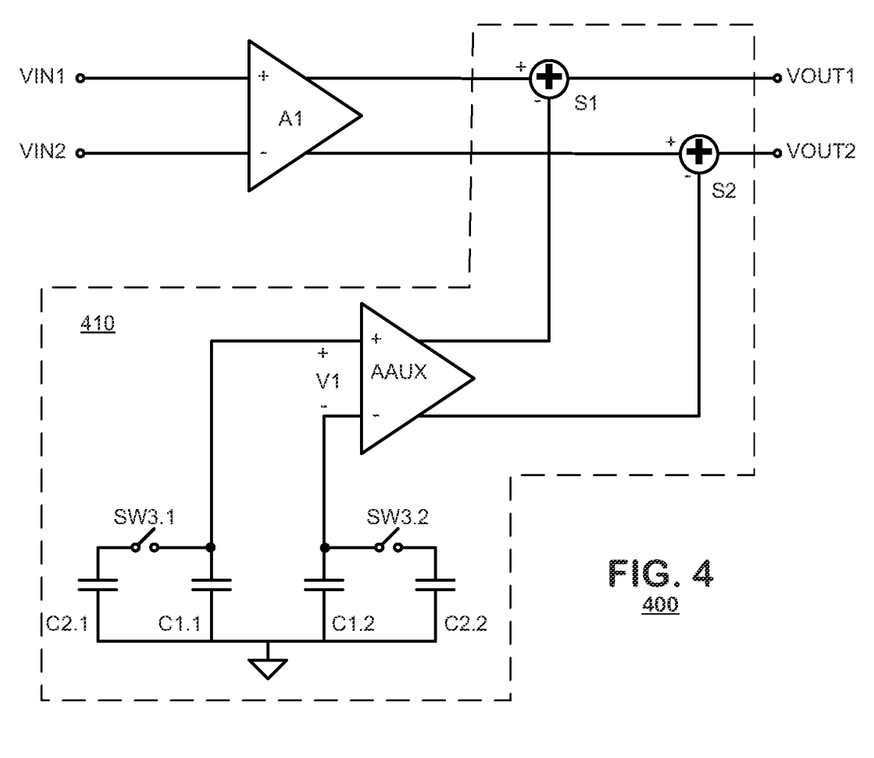
FIG. 4 illustrates an amplifier system according to a further embodiment of the present invention.

FIG. 4 illustrates an amplifier system 400 according to another embodiment of the present invention. In FIG. 4, auto-zero capacitors C1.1 and C1.2 do not appear in the signal path. The amplifier system 400 may include a main differential amplifier A1. The auto-zero circuit 410 may include an auxiliary differential amplifier Aaux, the auto-zero capacitors C2.1 and C2.2, and subtraction units S1 and S2. An auto-zero voltage V1, stored across the auto-zero capacitors C1.1 and C2.1, may be amplified by the auxiliary differential amplifier Aaux. The output voltages of the auxiliary differential amplifier Aaux may be subtracted from the output voltages of the main differential amplifier A1 by the subtraction units S1 and S2 so that the voltages at the output nodes VOUT1 and VOUT2 exhibit a zero offset voltage. Various techniques may be used to generate the desired auto-zero voltage V1. For example, the auto-zero voltage V1 may be set by the output voltage of a differential amplifier that samples voltages at the output nodes VOUT1 and VOUT2 when the input nodes VIN1 and VIN2 may be shorted to a common voltage.

As previously discussed, the auxiliary capacitors C2.1 and C2.2, the switches SW3.1 and SW3.2, and the auto-zero capacitors C1.1 and C1.2 may form two low-pass filters. The capacitance of the auxiliary capacitors C2.1 and C2.2 may control the auto-zero noise independently of the acquisition bandwidth.

Figure 5:
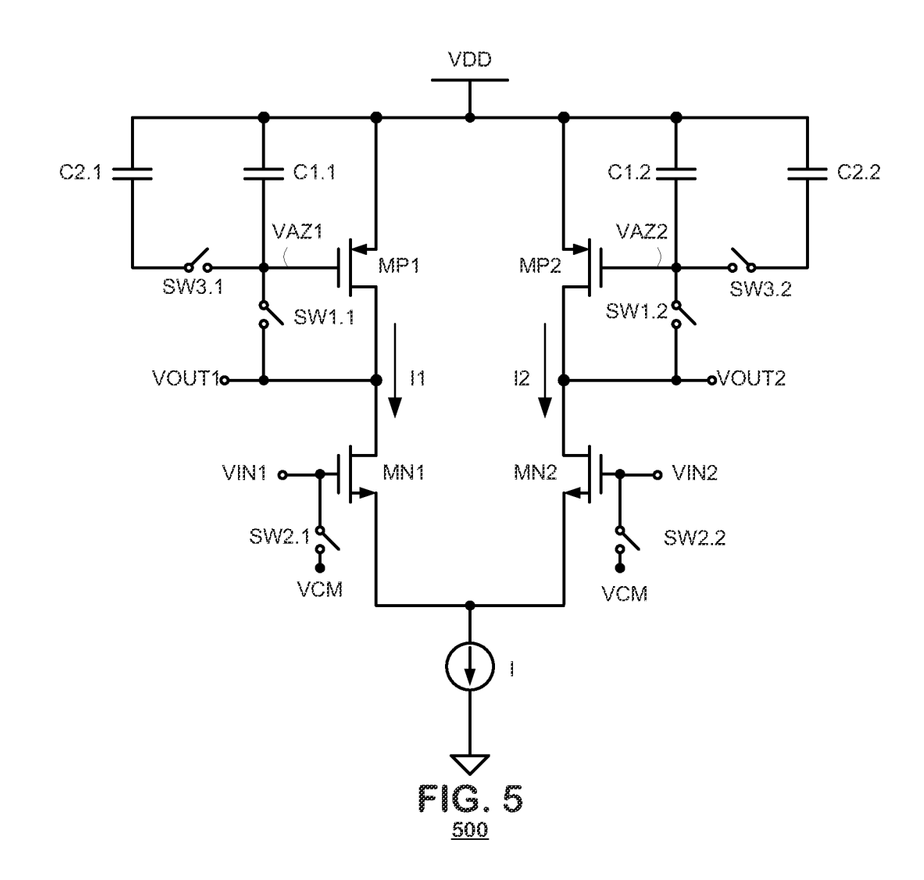
FIG. 5 illustrates an implementation of the amplifier system of FIG. 2 according to an embodiment of the present invention.

FIG. 5 illustrates an implementation of the low noise auto-zero circuit of FIG. 2 for a differential amplifier 500 according to an embodiment of the present invention. The differential amplifier 500 may include n-channel MOSFETs (NMOS transistors) MN1 and MN2, p-channel MOSFETs (PMOS transistors) MP1 and MP2, and a current source I. A positive power supply level is shown as voltage VDD and a negative power supply level is shown as ground. The input terminals of the differential amplifier (VIN1 and VIN2) may be coupled to gates of respective NMOS transistors MN1 and MN2. Drains of each of the NMOS transistors may be coupled to drains of a respective PMOS transistor MP1 and MP2. Sources of the NMOS transistors MN1 and MN2 may be coupled to a common terminal of the current source I. Output terminals of the amplifier 500 may be connected to the drains connections of each transistor pair MN1/MP1 and MN2/MP2. The circuit may generate output voltages at the output nodes VOUT1 and VOUT2 based on the input voltages.

The PMOS transistors MP1 and MP2 may function as current-source load devices for the NMOS transistors MN1 and MN2. Assume that the input offset voltage is $V_{OS}$, the transconductance of the PMOS transistors is $g_{mp}$, the transconductance for the NMOS transistors is $g_{mn}$, and the clock frequency for the switches SW3.1 and SW3.2 is $f_{CLK}$. The current source I may supply the total drain current, I1+I2, for the NMOS transistors MN1 and MN2. For the purpose of the present discussion, the architecture and topology of the current source are immaterial to the operation of the present invention.

The auto-zero circuit may include auto-zero capacitors C1.1 and C1.2, auxiliary capacitors C2.1 and C2.2, and switches SW1.1, SW1.2, SW2.1, SW2.2, SW3.1 and SW3.2. In an acquisition phase, switches SW1.1, SW1.2, SW2.1 and SW2.2 may close, and switches SW3.1 and SW3.2 may open. Thus, the input nodes VIN1 and VIN2 may be shorted to the common-mode voltage VCM, and the PMOS transistors MP1 and MP2 may be diode-connected. Therefore, in the acquisition phase, the circuit may become an NMOS differential pair with diode-connected PMOS loads.

In the hold phase, switches SW3.1 and SW3.2 may close, and switches SW1.1, SW1.2, SW2.1 and SW2.2 may open. Thus, the input short is removed and the PMOS transistors are no longer diode-connected. As previously discussed, the charges stored on the auto-zero capacitors C1.1 and C1.2 may be redistributed with the auxiliary capacitors C2.1 and C2.2. After multiple cycles of the acquisition-hold operation, voltages on the auto-zero and auxiliary capacitors C1.1, C1.2, C2.1 and C2.2 should reach equilibrium and contribute to offset cancellation.

Figure 6:
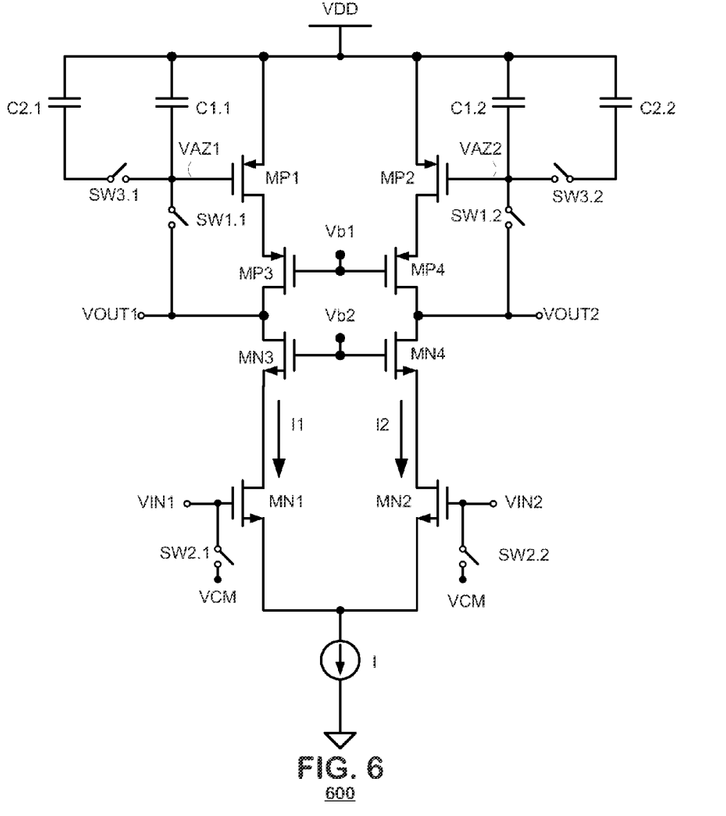
FIG. 6 illustrates another implementation of the amplifier system of FIG. 2 according to an embodiment of the present invention.

FIG. 6 illustrates an implementation of the low noise auto-zero circuit of FIG. 2 for a differential telescopic cascode amplifier according to an embodiment of the present invention. The amplifier may employ a cascode differential pair with cascode loads. The amplifier 600 may include NMOS transistors MN1, MN2, MN3 and MN4, PMOS transistors MP1, MP2, MP3, and MP4, and current source I. The NMOS transistors MN1 and MN2 may function as the input devices, and the NMOS transistors MN3 and MN4 may function as the cascode devices. The PMOS transistors MP1, MP2, MP3, and MP4 may function as cascode current source loads. As depicted in FIG. 6, biasing voltage VB1 may be applied to the gates of the PMOS transistors MP3 and MP4 and biasing voltage VB2 may be applied to the gates of the NMOS transistors MN3 and MN4. The current source I may supply the total drain current, I1+I2, for the NMOS transistors MN1 and MN2.

The auto-zero circuit may include auto-zero capacitors C1.1 and C1.2, auxiliary capacitors C2.1 and C2.2, and switches SW1.1, SW1.2, SW2.1, SW2.2, SW3.1 and SW3.2. The auto-zero circuit operates similar to the auto-zero circuit depicted in FIG. 5. In the acquisition phase, similar to the diode-connected PMOS transistors in FIG. 5, the output nodes VOUT1 and VOUT2 may be connected to the gates of the PMOS transistor MP1 and MP2, respectively. Thus, similar to the auto-zero operation previously discussed, by adjusting the capacitance of the auxiliary capacitors C2.1 and C2.2, the auto-zero noise may be controlled independently of the acquisition bandwidth.

Figure 7:
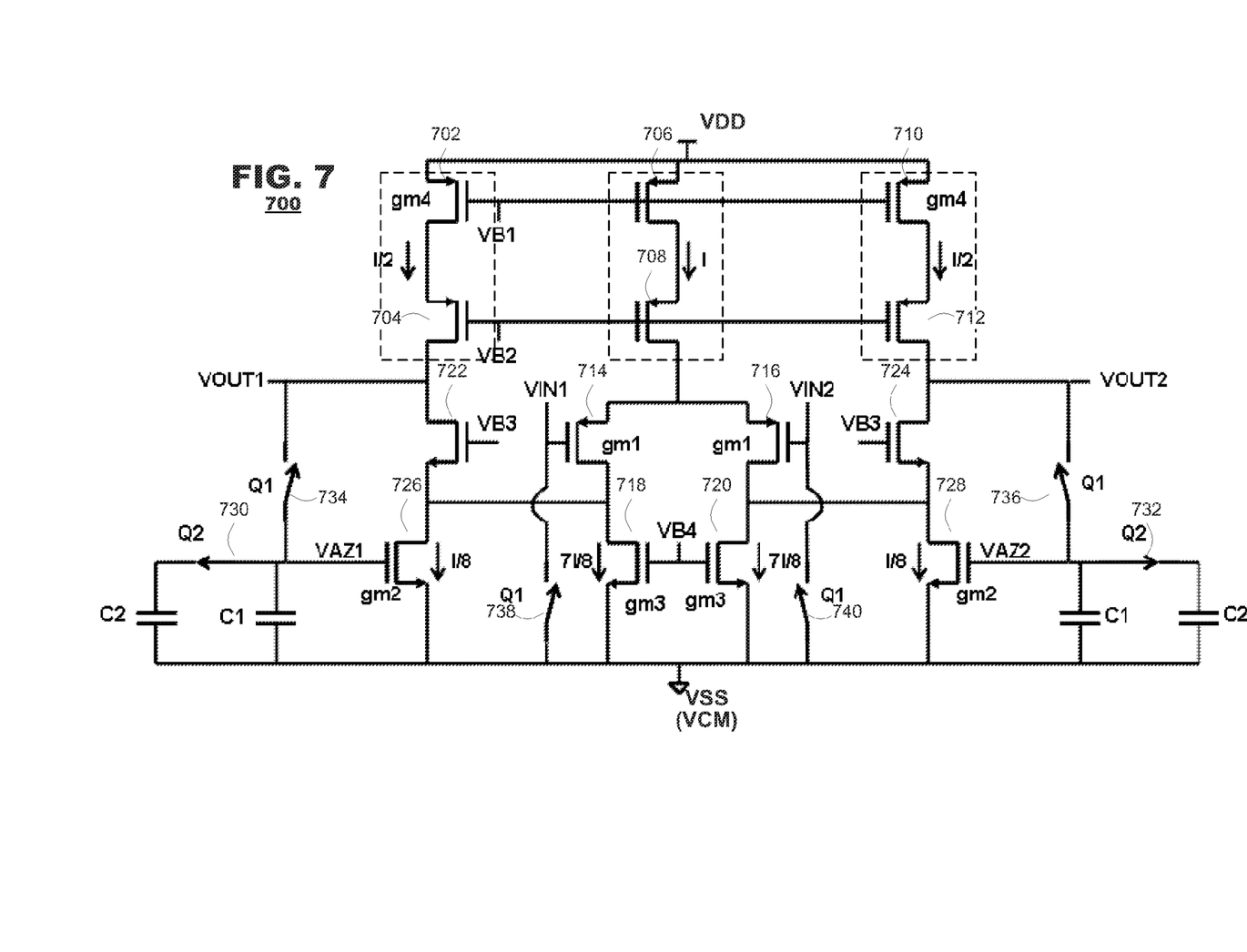
FIG. 7 illustrates an amplifier system according to another embodiment of the present invention.

FIG. 7 is a circuit diagram of an amplifier system 700 according to another embodiment of the present invention. As illustrated, the amplifier system 700 may be provided as a folded cascode amplifier. The amplifier 700 may include transistors 706, 708 provided as a current source for a pair of transistors 714, 716 provided as an input differential pair. Transistors 718, 720 may function as current sources, while transistors 726, 728 may function as current sources in a hold mode, and be diode-connected in an acquisition mode. Transistors 722 and 724 may be provided as cascode devices for the amplifier, while current sources 702, 704 and 710, 712 may be provided as active loads for the amplifier. Output terminals VOUT1, VOUT2 of the amplifier system 700 may be taken from drains of transistors 722, 724. In this regard, the amplifier 700 possesses a traditional folded cascode structure.

According to an embodiment of the invention, the amplifier system 700 may include a pair of auto-zero capacitors C1.1, C1.2 and a pair of auxiliary capacitors C2.1, C2.2 provided in parallel with the auto-zero capacitors C1.1, C1.2. The auto-zero capacitors C1.1, C1.2 may connect between gates of transistors 726 and 728 (nodes VAZ1 and VAZ2, respectively) and ground, which constitutes VCM, in this embodiment. The auxiliary capacitors C2.1, C2.2 may connect to nodes VAZ1, VAZ2 via respective switches 730, 732 which selectively switch the auxiliary capacitors in and out of the circuit. A second set of switches 734, 736 may connect nodes VAZ1 and VAZ2 respectively to the output terminals VOUT1, VOUT2, diode-connecting transistors 726, 728. Another set of switches 738, 740 may connect the input terminals VIN1, VIN2 to ground, the common mode voltage in this embodiment.

During operation, switches 734, 736, 738 and 740 may close during the acquisition phase and switches 730, 732 may open. Closure of switches 738 and 740 applies the common mode voltage VCM to the inputs of the paired transistors 714, 716. Voltages generated at the output terminals VOUT1, VOUT2 may be captured at the auto-zero capacitors C1.1, C1.2 through switches 734 and 736.

During the hold phase, switches 730 and 732 may close and switches 734, 736, 738 and 740 may open. Closure of switches 730, 732 may connect the auto-zero capacitors C1.1, C1.2 to their counterpart auxiliary capacitors C2.1, C2.2. Voltages developed at nodes VAZ1, VAZ2 may drive transistors 726 and 728 which may contribute to voltages developed at the output terminals VOUT1 and VOUT2.

As with the prior embodiments, the embodiment of FIG. 7 may charge the auxiliary capacitors C2.1, C2.2 to voltages sufficient to combat voltage offsets that otherwise would be induced in the amplifier system 700. The auxiliary capacitors C2.1, C2.2 may charge to these voltages over multiple cycles of operation. Cycle-to-cycle noise contributions that otherwise would be present on the auto-zero capacitors C1.1, C1.2 may be reduced by presence of the auxiliary capacitors.

In the embodiment of FIG. 7, NMOS current sources (e.g., 718 and 726, 720 and 728) sink the current sourced by PMOS transistors 704, 708, and 712. Circuit designers may size transistors 718, 720, 726 and 728 to distribute source current to transistors 718, 720 and to transistors 726, 728 as desired. This structure allows circuit designs to make the current and, therefore, the gm of transistors 726, 728 smaller. Reducing gm for transistors 726, 728 may reduce the noise on the auto-zero and auxiliary capacitors when referred to the input.

Figure 8:
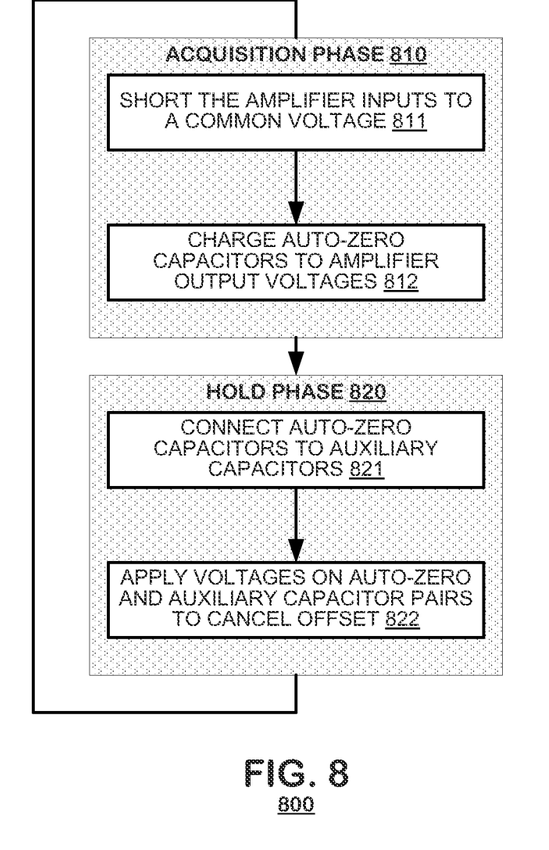
FIG. 8 illustrates a method according to an embodiment of the present invention.

FIG. 8 illustrates a low noise auto-zero method according to an embodiment of the present invention. The method may proceed in an acquisition phase 810 and a hold phase 820. During the acquisition phase, the method 800 may short inputs of an amplifier to common mode voltage (box 811). The method 800 further may charge auto-zero capacitors according to the amplifier's output voltages (box 812). During the hold phase, the method may connect auto-zero capacitors to auxiliary capacitors (box 821) and may apply voltages from the auto zero capacitors and auxiliary capacitor pairs to the amplifier's outputs (box 822). In this manner, the amplifier's offset should be canceled.

Figure 9:
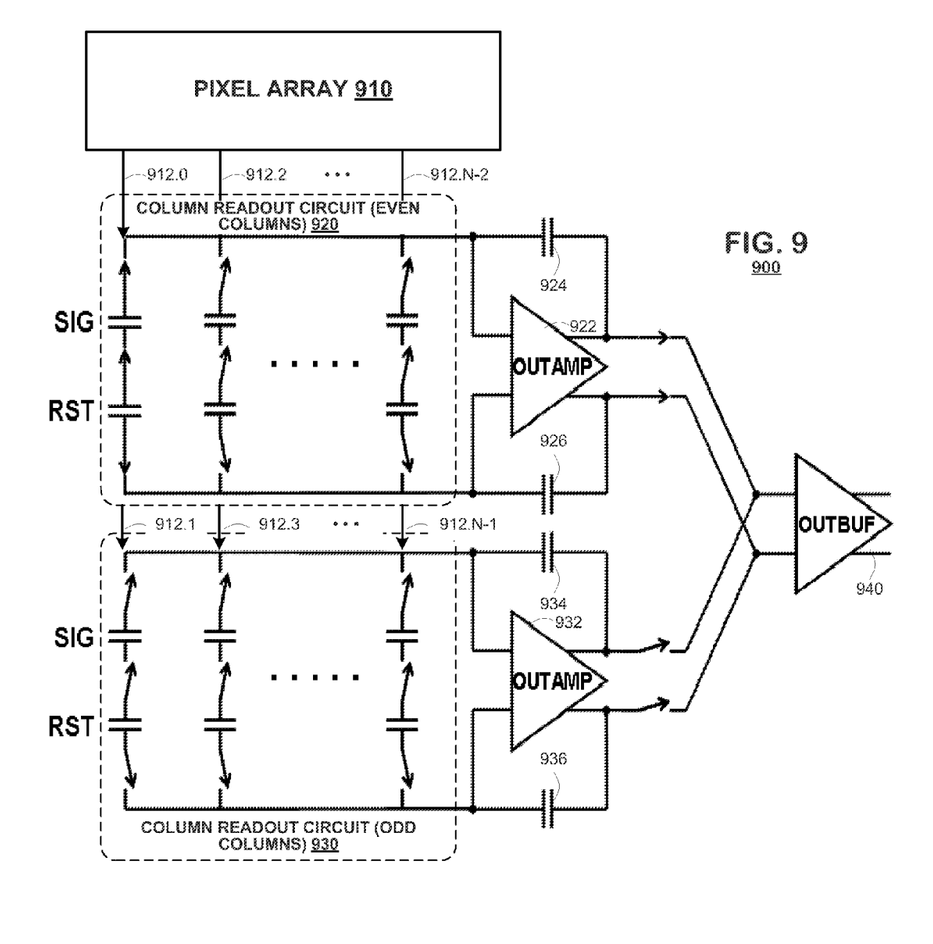
FIG. 9 illustrates a ping-pong readout circuit according to an embodiment of the present invention.

FIG. 9 illustrates a circuit system 900 in which a ping-pong readout may be performed. FIG. 9 illustrates application to an imaging device that includes a pixel array 910, a pair of column readout circuits 920, 930, output amplifiers 922 and 932, and a common output buffer 940. The pixel array 910 may be provided as a two-dimensional array of rows and columns. Typically, the pixel array 910 may operate to access all pixels in a common row simultaneously and output signals from a plurality of pixels in a common row over a plurality of parallel column output lines 912.0-912.N–1 where N is the number of columns. The readout circuits 920, 930 may include sampling capacitors SIG provided for each of the column output lines 912.0-912.N–1 to sample pixel signal values from a selected row of the array 910. In the embodiment illustrated in FIG. 9, the readout circuits 920, 930 may perform correlated double sampling and, therefore, the readout circuit may include second capacitors RST coupled to each of the column output lines 912.0-912.N–1 to sample reset values of selected pixels in the array. The exact details of the sample operations are not shown as they are not relevant to the present discussion. Even column signal and reset levels may be sampled by column readout circuit 920 while odd column signal and reset levels may be sampled by column readout circuit 930.

The column readout circuits 920, 930 may connect to respective output amplifiers 922, 932, and feedback capacitors 924, 926, 934 and 936. Once sampled, the column readout circuits 920, 930 alternately transfer charge to output amplifiers 922, 932 in a ping-pong fashion. Similarly, the outputs of the output amplifiers 922, 932 alternately connect to a common output buffer 940, producing a single signal stream alternating between even and odd pixel levels. The readout amplifiers 922, 932 may include offset correction circuits according to any of the foregoing embodiments. Without offset correction, even and odd signal levels would include voltage offsets with respect to one another, producing objectionable patterns in the image.

Although the foregoing discussion has described the present invention in the context of amplifier systems, the principles of the present invention are not so limited. Embodiments of the present invention also find application in other circuit systems where cancelation of amplifier-induced offsets is desirable including, for example, comparators. In such applications, the circuits illustrated in FIGS. 2-7 may find application as front end circuits within a comparator system.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. A circuit system, comprising:
   a first transconductance amplifier having a pair of inputs coupled to input terminals of the system and coupled to a common mode voltage source via a first pair of switches,
   a second transconductance amplifier, having a pair of inputs coupled via a second pair of switches to outputs of the first transconductance amplifier and having outputs also coupled to outputs of the first transconductance amplifier,
   a pair of auto-zero capacitors, each coupled to a respective input of the second transconductance amplifier at first terminals thereof and connected to a common voltage at second terminals thereof, and
   a pair of auxiliary capacitors, each provided in parallel with a corresponding auto-zero capacitor via a respective third switch.

2. The circuit system of claim 1, wherein the auto-zero capacitors capture a voltage of the circuit system during an acquisition phase of the system and induce an offset-canceling voltage within the circuit system during a hold phase of the system.

3. The circuit system of claim 1, wherein the first switches and second switches open and close in common with each other.

4. The circuit system of claim 2, wherein, during an acquisition phase, the first and second switches are closed.

5. The circuit system of claim 2, wherein, during a hold phase, the first and second switches are open.

6. The circuit system of claim 1, wherein the auxiliary capacitors charge to a representation of the offset voltage of the system over several cycles of operation.

7. The circuit system of claim 1, wherein capacitance of the auxiliary capacitors exceeds capacitance of the auto-zero capacitors.

8. The circuit system of claim 1, wherein the switches couple the auxiliary capacitors to the respective auto-zero capacitors during a hold phase of the system and decouple the auxiliary capacitors from the respective auto-zero capacitors during an acquisition phase of the system.

9. The circuit system of claim 1, wherein the first and second switches open and close in phase with each other and out of phase with opening and closing of the third switches.

10. The circuit system of claim 1, wherein output terminals of the system are coupled to respective outputs of the first transconductance amplifier.

11. A circuit system comprising:
    a differential amplifier having a pair of inputs coupled to respective input terminals of the system and coupled to a common mode voltage via respective first switches,
    a pair of auto-zero capacitors, each coupled to a respective output of the differential amplifier at a first terminal thereof and coupled to the common mode voltage via respective second switches,
    a pair of auxiliary capacitors, each coupled to a respective output of the differential amplifier at a first terminal thereof and coupled to a second terminal of a respective auto-zero capacitor via a respective third switch to achieve a current path between the respective auxiliary capacitor and the second terminal of the respective auto-zero capacitor.

12. The circuit system of claim 11, wherein the auxiliary capacitors charge to a representation of an offset voltage of the system over several cycles of operation.

13. The circuit system of claim 11, wherein the first and second switches open and close in phase with each other and out of phase with opening and closing of the third switches.

14. The circuit system of claim 11, wherein capacitance of the auxiliary capacitors exceeds capacitance of the auto-zero capacitors.

15. The circuit system of claim 11, wherein output terminals of the system are coupled to the second terminals of the auto-zero capacitors.

16. A circuit system comprising:
   a differential amplifier having a pair of first switches each coupled between an input and a respective output of the differential amplifier,
   a pair of auto-zero capacitors, each having a first terminal coupled to a respective input of the differential amplifier and a second terminal coupled to a common mode voltage via a respective second switch,
   a pair of auxiliary capacitors, each having: (i) a first terminal coupled to a respective input of the differential amplifier and the first terminal of a respective auto-zero capacitor via a respective third switch to achieve a current path between the first terminals of a respective auxiliary capacitor and the respective auto-zero capacitor, and (ii) second terminal coupled to the second terminal of the respective auto-zero capacitor.

17. The circuit system of claim 16, wherein the auxiliary capacitors charge to a representation of an offset voltage of the system over several cycles of operation.

18. The circuit system of claim 16, wherein the first and second switches open and close in phase with each other and out of phase with opening and closing of the third switches.

19. The circuit system of claim 16, wherein capacitance of the auxiliary capacitors exceeds capacitance of the auto-zero capacitors.

20. The circuit system of claim 16, wherein output terminals of the system are coupled to the output terminals of the differential amplifier.

21. A circuit system comprising:
   a differential amplifier having a pair of inputs coupled to respective input terminals of the system,
   an auto-zero circuit comprising:
      an auxiliary differential amplifier,
      a pair of auto-zero capacitors, each having a first terminal coupled to a respective input of the auxiliary differential amplifier and a second terminal coupled to a common voltage, and
      a pair of auxiliary capacitors, each having a first terminal coupled to a first terminal of a respective auto-zero capacitor via a switch and a second terminal coupled to the common voltage; and
   a pair of subtractors, each having inputs coupled to an output of the differential amplifier and an output of the auxiliary differential amplifier.

22. The circuit system of claim 21, wherein the auxiliary capacitors charge to a representation of an offset voltage of the system over several cycles of operation.

23. The circuit system of claim 21, wherein capacitance of the auxiliary capacitors exceeds capacitance of the auto-zero capacitors.

24. A circuit system, comprising:
   a pair of differential amplifiers, each having inputs coupled to a signal source via respective input switches and having outputs coupled to an output terminal via respective output switches, each differential amplifier having a pair of auto-zero capacitors each provided in a signal path between an input and an output of the respective differential amplifier, and a pair of auxiliary capacitors each coupled in parallel with a corresponding auto-zero capacitor via a connecting switch, wherein
   input switches of a first differential amplifier and output switches of a second differential amplifier are closed in a first phase of operation and open in a second phase of operation, and
   input switches of a second differential amplifier and output switches of a first differential amplifier are closed in the second phase of operation and open in the first phase of operation.

25. A circuit system, comprising:
   means for amplifying a differential signal presented at the circuit system and generating a differential output signal therefrom,
   a pair of auto-zero capacitors, each provided in a signal path between a differential input signal and a differential output signal, and
   a pair of auxiliary capacitors, each provided in parallel with a corresponding auto-zero capacitor via a connecting switch defining parallel current paths between each auxiliary capacitor and its corresponding auto-zero capacitor.

* * * * *